(12) United States Patent
Barowski et al.

(10) Patent No.: US 10,587,248 B2
(45) Date of Patent: *Mar. 10, 2020

(54) DIGITAL LOGIC CIRCUIT FOR DETERRING RACE VIOLATIONS AT AN ARRAY TEST CONTROL BOUNDARY USING AN INVERTED ARRAY CLOCK SIGNAL FEATURE

(71) Applicant: International Business Machines Corporation, Armonk, NY (US)

(72) Inventors: Harry Barowski, Boeblingen (DE); Werner Juchmes, Boeblingen (DE); Michael B. Kugel, Boeblingen (DE); Wolfgang Penth, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 182 days.

This patent is subject to a terminal disclaimer.

(21) Appl. No.: 15/414,600

(22) Filed: Jan. 24, 2017

(65) Prior Publication Data

US 2018/0212594 A1 Jul. 26, 2018

(51) Int. Cl.
*H03K 3/037* (2006.01)
*G11C 11/413* (2006.01)
(Continued)

(52) U.S. Cl.
CPC ..... *H03K 3/0375* (2013.01); *G01R 31/31725* (2013.01); *G01R 31/31727* (2013.01);
(Continued)

(58) Field of Classification Search
CPC .......... H03K 3/00; H03K 3/027; H03K 3/037; H03K 3/0375; H03K 19/00; H03K 19/003; H03K 19/00323; H03K 19/1774; H04L 7/0083; G06F 17/00; G06F 17/50; G06F 17/5045; G06F 17/505; G06F 17/5059; G06F 17/5031; G06F 2217/84; G06F 1/04; G06F 1/08; G06F 9/3869; G01R 31/28;
(Continued)

(56) References Cited

U.S. PATENT DOCUMENTS 6,032,278 A * 2/2000 Parvathala ..... G01R 31/318541
365/201
6,825,695 B1 11/2004 Dhong et al.
(Continued)

OTHER PUBLICATIONS

Singh et al.; "A Review on Clock Gating Methodologies for power minimization in VLSI circuits"; International Journal of Scientific Engineering and Applied Science; <http://ijseas.com/volume2/v2i1/ijseas20160133.pdf>; Jan. 2016.
(Continued)

*Primary Examiner* — Kyle Vallecillo
(74) *Attorney, Agent, or Firm* — Nathan M. Rau (57) ABSTRACT

Disclosed aspects relate to a digital logic circuit. A clock generation circuitry has both a clock generation circuitry output and an inverter circuit to generate a derivative clock signal feature by inverting an array clock signal feature. A scanable storage element has both a scanable storage element output and a set of flip-flops. A memory array is connected with the scanable storage element output and the array clock signal feature. The digital logic circuit is configured to avoid a race violation.

19 Claims, 5 Drawing Sheets

(51) Int. Cl.
  *G01R 31/317* (2006.01)
  *G11C 7/22* (2006.01)
  *G11C 29/50* (2006.01)
  *G11C 29/12* (2006.01)
  *G11C 29/32* (2006.01)
  *G01R 31/3185* (2006.01)

(52) U.S. Cl.
  CPC ........ *G01R 31/318541* (2013.01); *G11C 7/22* (2013.01); *G11C 11/413* (2013.01); *G11C 29/12015* (2013.01); *G11C 29/32* (2013.01); *G11C 29/50* (2013.01); *G11C 7/222* (2013.01)

(58) Field of Classification Search
  CPC ............ G01R 31/317; G01R 31/31725; G01R 31/31727; G01R 31/318525; G01R 31/318522; G01R 31/318544; G11C 11/413; G11C 7/22; G11C 29/12015; G11C 29/32; G11C 29/50; G11C 7/222
  See application file for complete search history.

(56) References Cited

U.S. PATENT DOCUMENTS

| | | | |
|---|---|---|---|
| 7,373,572 B2* | 5/2008 | Mak | G01R 31/318583 327/202 |
| 7,548,089 B1 | 6/2009 | Bauer et al. | |
| 7,586,337 B2 | 9/2009 | Nozaki | |
| 7,685,457 B2 | 3/2010 | Jacobson et al. | |
| 7,911,239 B2 | 3/2011 | Saint-Laurent et al. | |
| 8,244,512 B1 | 8/2012 | Tseng et al. | |
| 8,421,514 B1 | 4/2013 | Yeung et al. | |
| 8,643,421 B1 | 2/2014 | Aipperspach et al. | |
| 9,098,659 B2 | 8/2015 | Dengler et al. | |
| 9,406,375 B1 | 8/2016 | Barowski et al. | |
| 9,558,309 B2 | 1/2017 | Beerel et al. | |
| 2004/0090258 A1* | 5/2004 | Ohnishi | G06F 1/04 327/291 |
| 2004/0155678 A1* | 8/2004 | Anderson | G01R 31/318541 326/46 |
| 2005/0050418 A1* | 3/2005 | Gass | G01R 31/318541 714/726 |
| 2007/0001728 A1* | 1/2007 | Branch | H03K 3/35625 327/202 |
| 2007/0001729 A1* | 1/2007 | Branch | H03K 3/35625 327/202 |
| 2007/0001730 A1* | 1/2007 | Branch | G01R 31/318594 327/218 |
| 2007/0001731 A1* | 1/2007 | Branch | G01R 31/318575 327/218 |
| 2007/0001732 A1* | 1/2007 | Branch | G01R 31/318552 327/218 |
| 2007/0022336 A1* | 1/2007 | Branch | G01R 31/318541 714/724 |
| 2007/0022339 A1* | 1/2007 | Branch | G01R 31/318552 714/726 |
| 2007/0022344 A1* | 1/2007 | Branch | G01R 31/318544 714/731 |
| 2007/0096957 A1* | 5/2007 | Papaefthymiou | H03K 3/356139 341/51 |
| 2008/0101522 A1* | 5/2008 | Ngo | G01R 31/318552 375/372 |
| 2009/0106608 A1* | 4/2009 | Grise | G01R 31/318541 714/726 |
| 2010/0164586 A1 | 7/2010 | Sautter et al. | |
| 2013/0091375 A1 | 4/2013 | Dengler et al. | |
| 2015/0214951 A1 | 7/2015 | Peng | |
| 2016/0098506 A1 | 4/2016 | Agarwal et al. | |
| 2016/0241241 A1 | 8/2016 | Mäkipää et al. | |

OTHER PUBLICATIONS

Barowski et al., "Digital Logic Circuit", U.S. Appl. No. 15/899,497, filed Feb. 20, 2018.
List of IBM Patents or Patent Applications Treated as Related, dated Feb. 19, 2018, 2 pages.
Accelerated Examination Support Document, dated Feb. 2, 2018, 19 pages.

* cited by examiner

DIGITAL LOGIC CIRCUIT FOR DETERRING RACE VIOLATIONS AT AN ARRAY TEST CONTROL BOUNDARY USING AN INVERTED ARRAY CLOCK SIGNAL FEATURE

BACKGROUND

This disclosure relates generally to a digital logic circuit and, more particularly, relates to race violation deterrence.

SUMMARY

Aspects of the disclosure relate to deterring or preventing race violations at an array test control boundary. Local clock buffers may have contradicting test control requirements which can result in unpredictable outputs due to race violations. A pulsed clock is utilized to avoid such race violations caused by independently controlled clocks. Performance or efficiency benefits may result from aspects described herein such as the ability to use standard clock control logic, verification that race violations do not occur, various manual reviews may be avoided, potential hardware malfunction due to problems that were not seen during a manual review may be prevented, and beneficial early mode protection due to close clock tracking which can work for various delay/pulse-width settings or variations.

Aspects of the disclosure relate to a digital logic circuit which is configured to deter a race violation at an array test control boundary. A clock generation circuitry has both a clock generation circuitry output and an inverter circuit to generate a derivative clock signal feature by inverting an array clock signal feature. The clock generation circuitry is to generate the array clock signal feature, a primary scan clock signal feature, a secondary scan clock signal feature, and a pulsed clock signal feature. A scanable storage element has both a scanable storage element output and a set of flip-flops. The set of flip-flops includes a first primary flip-flop which corresponds to a functional data path of the digital logic circuit (the first primary flip-flop connects with the derivative clock signal feature), a second primary flip-flop which corresponds to a scan data path of the digital logic circuit (the second primary flip-flop connects with the primary scan clock signal feature), and a secondary flip-flop connected to both the pulsed clock signal feature and the secondary scan clock signal feature. The secondary flip-flop is configured to input the output of the first primary flip-flop when indicated by the pulsed clock signal feature, and the second primary flip-flop when indicated by the secondary scan clock signal feature. A memory array is connected with the scanable storage element output and the array clock signal feature. The digital logic circuit is configured to avoid the race violation between a set of output data of the first primary flip-flop and the pulsed clock signal feature at the secondary flip-flop independent of what the derivative clock signal feature indicates.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the disclosure relate to deterring or preventing race violations at an array test control boundary. Local clock buffers on different sides of a test control boundary may have contradicting test control requirements which can result in unpredictable outputs due to race violations caused by clock-hazards. The term clock-hazard can refer to a violation where the clocks of two consecutive latch or storage stages both indicate transparency at the same time. A pulsed clock is utilized to avoid a race violation when such a clock-hazard occurs with independently controlled clocks (a pulsed clock can refer to a clock signal feature with a cycle time independent pulse width where both the rising and falling clock edge are triggered by the same global clock edge and where the pulse width only depends on the signal pass-through time of a local clock buffer internal delay loop). A clock-hazard between the clock of the first primary flip-flop and the array clock is avoided by using a derivative clock. Performance or efficiency benefits may result from aspects described herein such as the ability to use standard clock control logic, verification that race violations do not occur, various manual reviews may be avoided, potential hardware malfunction due to problems that were not seen during a manual review may be prevented, and beneficial early mode protection due to close tracking between array and derivative clock which can work for various delay/pulse-width settings or variations.

Aspects of the disclosure relate to a digital logic circuit and a method of manufacture thereof. The digital logic circuit is configured to deter a race violation at an array test control boundary. A clock generation circuitry has both a clock generation circuitry output and an inverter circuit to generate a derivative clock signal feature by inverting an array clock signal feature. The clock generation circuitry is to generate the array clock signal feature, a primary scan clock signal feature, a secondary scan clock signal feature, and a pulsed clock signal feature. A scanable storage element has both a scanable storage element output and a set of flip-flops. The set of flip-flops includes a first primary flip-flop which corresponds to a functional data path of the digital logic circuit (the first primary flip-flop connects with the derivative clock signal feature), a second primary flip-flop which corresponds to a scan data path of the digital logic circuit (the second primary flip-flop connects with the primary scan clock signal feature), and a secondary flip-flop connected to both the pulsed clock signal feature and the secondary scan clock signal feature. The secondary flip-flop is configured to input the output of the first primary flip-flop when indicated by the pulsed clock signal feature, and the second primary flip-flop when indicated by the secondary scan clock signal feature. A memory array is connected with the scanable storage element output and the array clock signal feature. The digital logic circuit is configured to avoid the race violation between a set of output data of the first primary flip-flop and the pulsed clock signal feature at the secondary flip-flop independent of what the derivative clock signal feature indicates.

Figure 1:
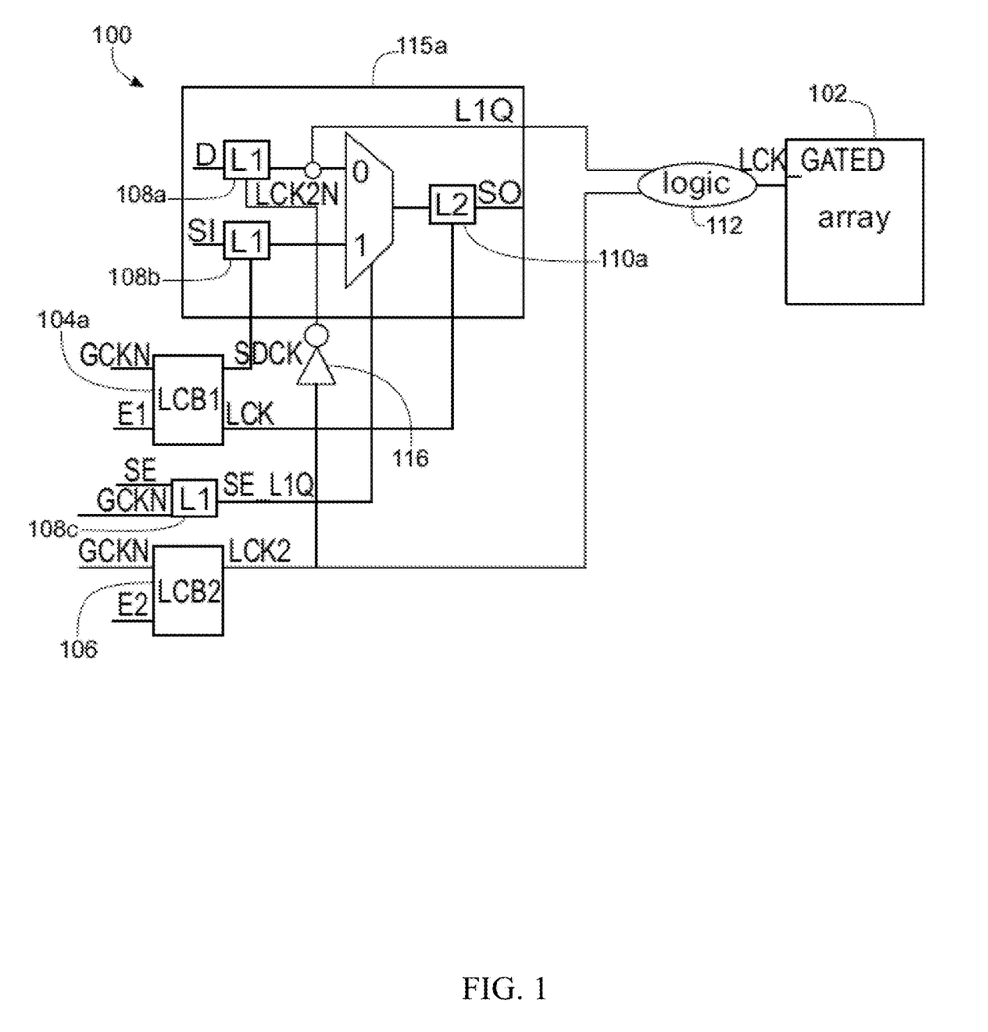
FIG. 1 depicts an example digital logic circuit configured to deter a race violation at an array test control boundary, according to embodiments.

FIG. 1 depicts an example digital logic circuit 100 configured to deter a race violation at an array test control boundary, in accordance with at least one embodiment. The digital logic circuit 100 includes plurality of clock generation circuitries (LCB1, and LCB2) 104a, and 106, plurality of scanable storage elements (L1 and L2) 108a, 108b, and 110a, and a memory array 102. The clock generation circuitry (LCB1, and LCB2) 104a, and 106 having a clock generation circuitry output, and an inverter circuit 116 (shown and explained in conjunction with FIG. 4) to generate a derivative clock signal feature by inverting an array clock signal feature (LCK2). The "test control boundary" refers to two clocks being controlled by independent test control signals. FIG. 1 is explained in conjunction with FIG. 2.

Figure 2:
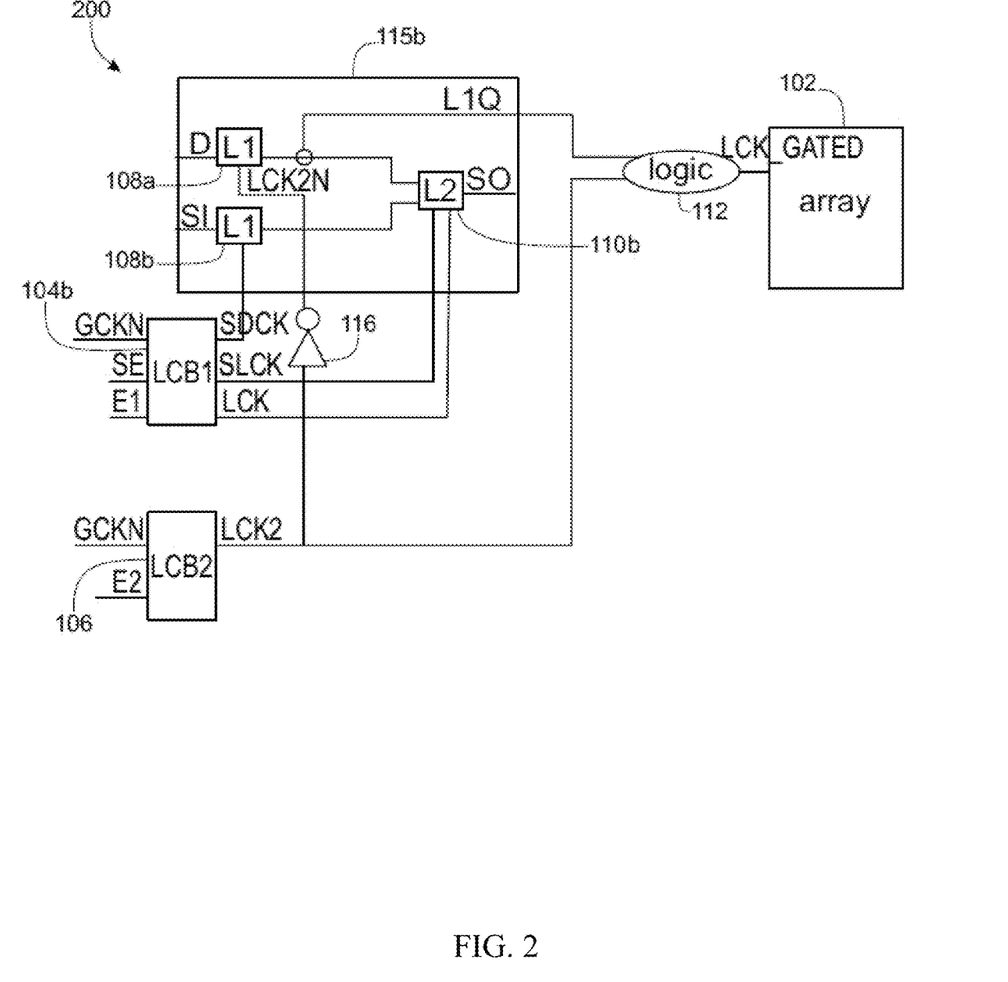
FIG. 2 depicts an illustrative digital logic circuit along with a primary scan clock signal feature, and a secondary scan clock signal feature to deter a race violation at an array test control boundary, according to embodiments.

FIG. 2 depicts an illustrative digital logic circuit 200 along with a primary scan clock signal feature (SDCK), and a secondary scan clock signal feature (SLCK) to deter a race violation at an array test control boundary, in accordance with at least one embodiment. The scanable storage elements 108a, 108b, and 110b are the latches to hold the data while clock is equal to 0, and transparent for data while clock is equal to 1. The clock generation circuitries 104b, and 106 generate the array clock signal feature (LCK2), a primary scan clock signal feature (SDCK), a secondary scan clock signal feature (SLCK), and a pulsed clock signal feature (LCK).

The scanable storage elements 108a, 108b, and 110b having a scanable storage element output, and a plurality of flip-flops. The set of flip-flops includes a first primary flip-flop, a second primary flip-flop, and a secondary flip-flop. The first primary flip-flop corresponds to a functional data path (D, L1Q, and LCK_GATED) of the digital logic circuit 100.

In an embodiment, the first primary flip-flop connects with the derivative clock signal feature. The second primary flip-flop corresponds to a scan data path (SI, SO) of the digital logic circuit 100. The SI and SO are scan input and scan output used for scan test. In an embodiment, the second primary flip-flop connects with the secondary scan clock signal feature (SLCK).

The secondary flip-flop connected to both the pulsed clock signal feature (LCK) and the scan clock signal feature (SDCK). In an embodiment, the secondary flip-flop is configured to input the output of the first primary flip-flop when indicated by the pulsed clock signal feature (LCK), and the second primary flip-flop when indicated by the secondary scan clock signal feature (SLCK).

The memory array 102 connected with the output of the flip-flop 108a and the array clock signal feature (LCK2). In an embodiment, the digital logic circuit 100 is configured to avoid the race violation between a set of output data of the first primary flip-flop and the pulsed clock signal feature (LCK) at the secondary flip-flop independent of what the derivative clock signal feature indicates.

The input (D) as shown in FIG. 1 and FIG. 2 includes but is not limited to read/write address, write data, read/write set. Furthermore FIG. 1 illustrates the logic 112 which could be an address decoder, data or set driver, etc.

The pulse length of the pulsed clock is chosen such that a race violation is avoided even if the L1, LCK2N is 1 while the pulsed LCK is 1 at the same time. In an embodiment the array input latch is scanable and testable by Logic Build in Self-Test (LBIST). Furthermore the array (RAM cells) 102 are testable by Array Build in Self-Test (ABIST).

In an embodiment, the second primary flip-flop and the secondary flip-flop are part of the scan data path. In an embodiment, the clock generation circuitries 104b, and 106 include a first local clock buffer LCB1 to generate the primary scan clock signal feature (SDCK), the secondary scan clock signal feature (SLCK), and the pulsed clock signal feature (LCK), and a second local clock buffer LCB2 to generate an array clock signal feature (LCK2).

In an embodiment, the clock generation circuitries 104b, and 106 are configured to output an output clock signal feature when indicated by enable input (E1 or E2 respectively). In an embodiment, the output clock signal feature includes the primary scan clock signal feature (SDCK), secondary scan clock signal feature (SLCK), and the pulsed clock signal feature (LCK). In an embodiment, the output clock signal feature is based on what a scan enable input (SE) indicates. SE is scan enable and also known as Scan Gate. In an embodiment when E1=1 and SE=1 the SDCK and SLCK clock signal features will be generated while LCK is being held at 0. In an embodiment when E1=1 and SE=0 the pulsed clock signal feature LCK will be generated while SDCK will be held at 1 and SLCK at 0. In an embodiment, the output clock signal feature includes the primary scan clock signal feature (SDCK), secondary scan clock signal feature (SLCK), and the pulsed clock signal feature (LCK).

The primary scan clock signal feature (SDCK), secondary scan clock signal feature (SLCK), and the pulsed clock signal feature (LCK) are derived from a common global clock signal feature (GCKN). In an embodiment, the array clock signal feature (LCK2) is derived from a common global clock signal feature (GCKN).

Figure 3:
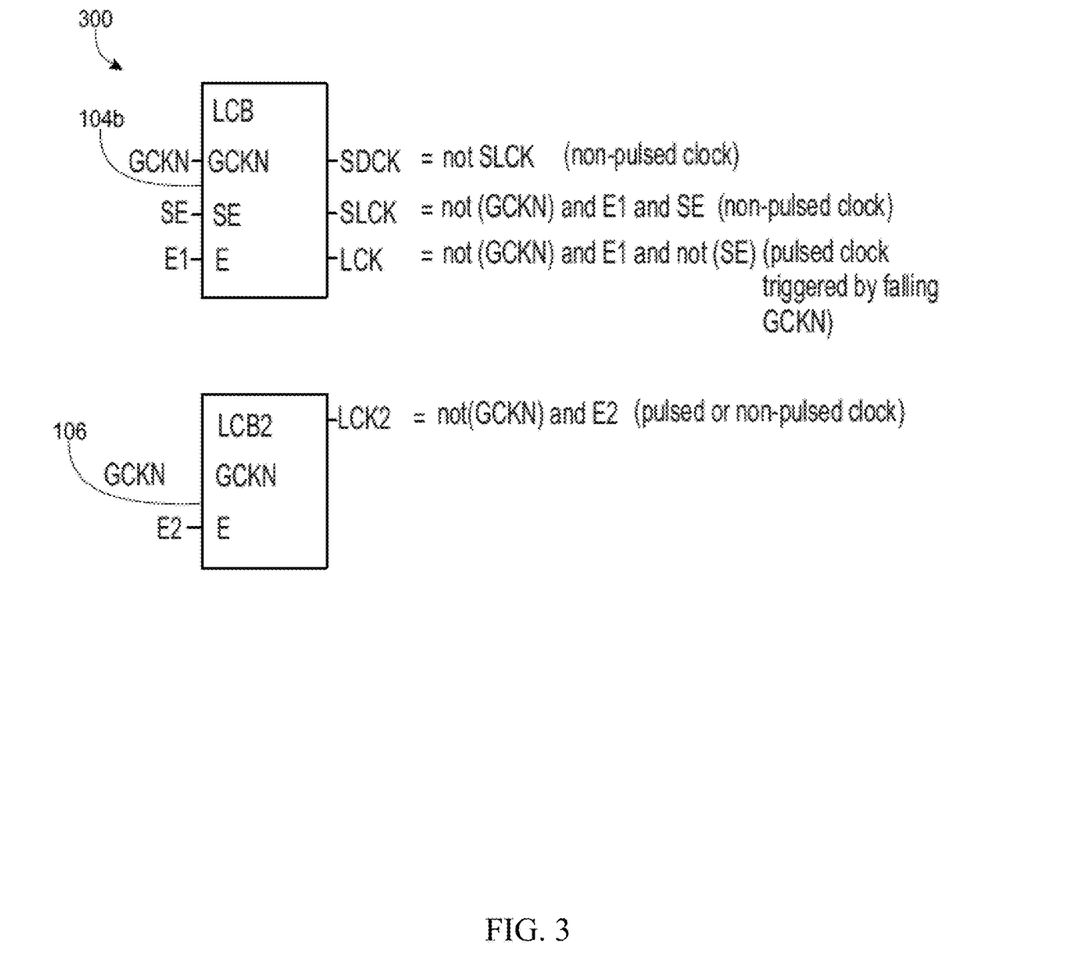
FIG. 3 illustrates the logical relation between a plurality of independent enable signals driven by functional and test control logic and the generated clock signal features, according to embodiments.

FIG. 3 illustrates the logical relation 300 between a plurality of independent enable signals driven by functional and test control logic and the generated clock signal features, in accordance with at least one embodiment. In an embodiment, the clock generation circuitries 104a/b, and 106 include a scan enable input (SE) to switch between the pulsed clock signal feature (LCK), the primary scan clock signal feature (SDCK) and the secondary scan clock signal feature (SLCK).

Figure 5:
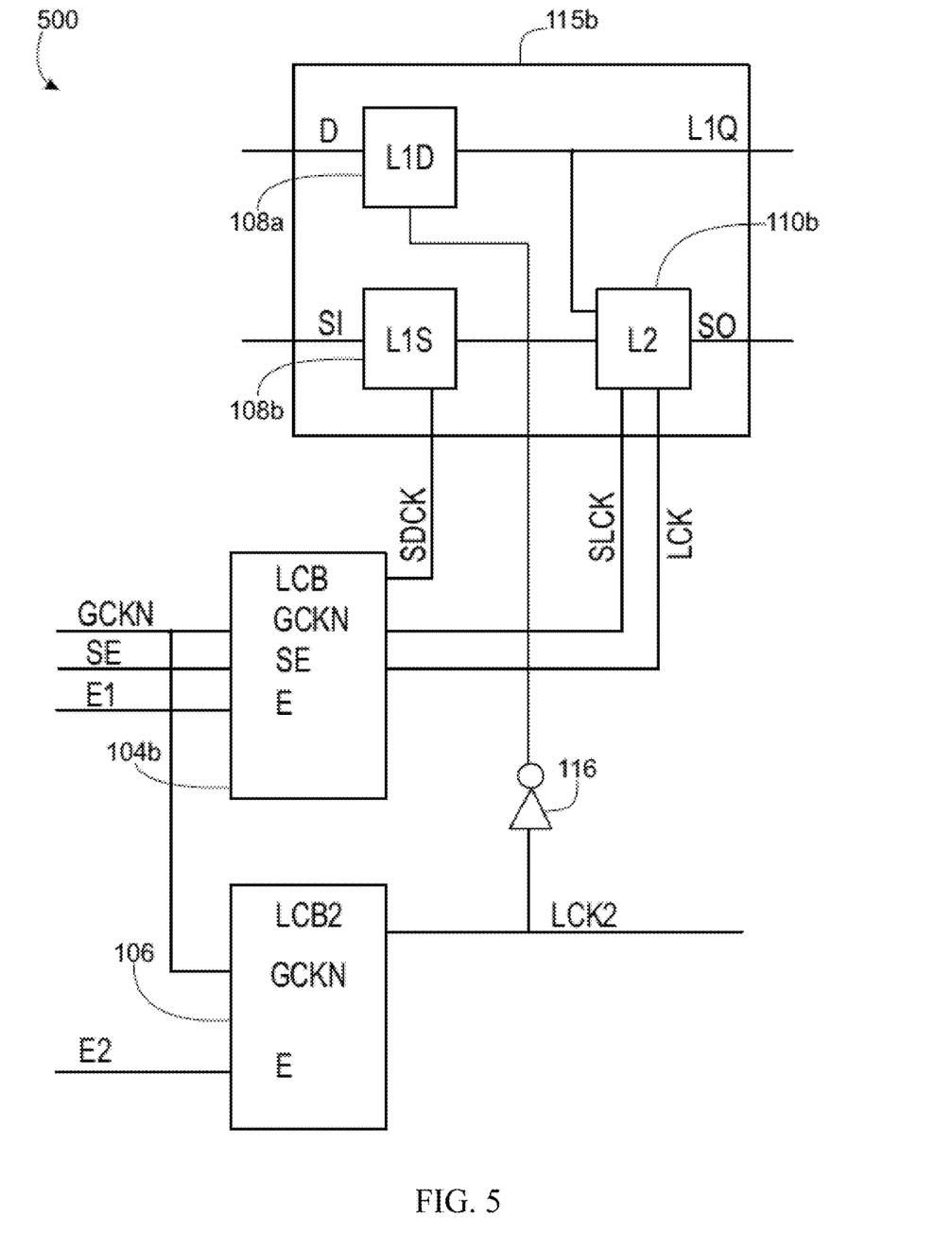
FIG. 5 illustrates an exemplary view of the independent enable signals driving into the digital logic circuit, according to embodiments.

As mentioned above, the primary scan clock signal feature (SDCK), the secondary scan clock signal feature (SLCK), and the pulsed clock signal feature (LCK) are derived from a common global clock signal feature (GCKN). FIG. 3 is explained in conjunction with FIG. 5 that illustrates an exemplary view 500 of the independent enable signals driving into the digital logic circuit, in accordance with at least one embodiment.

Figure 4:
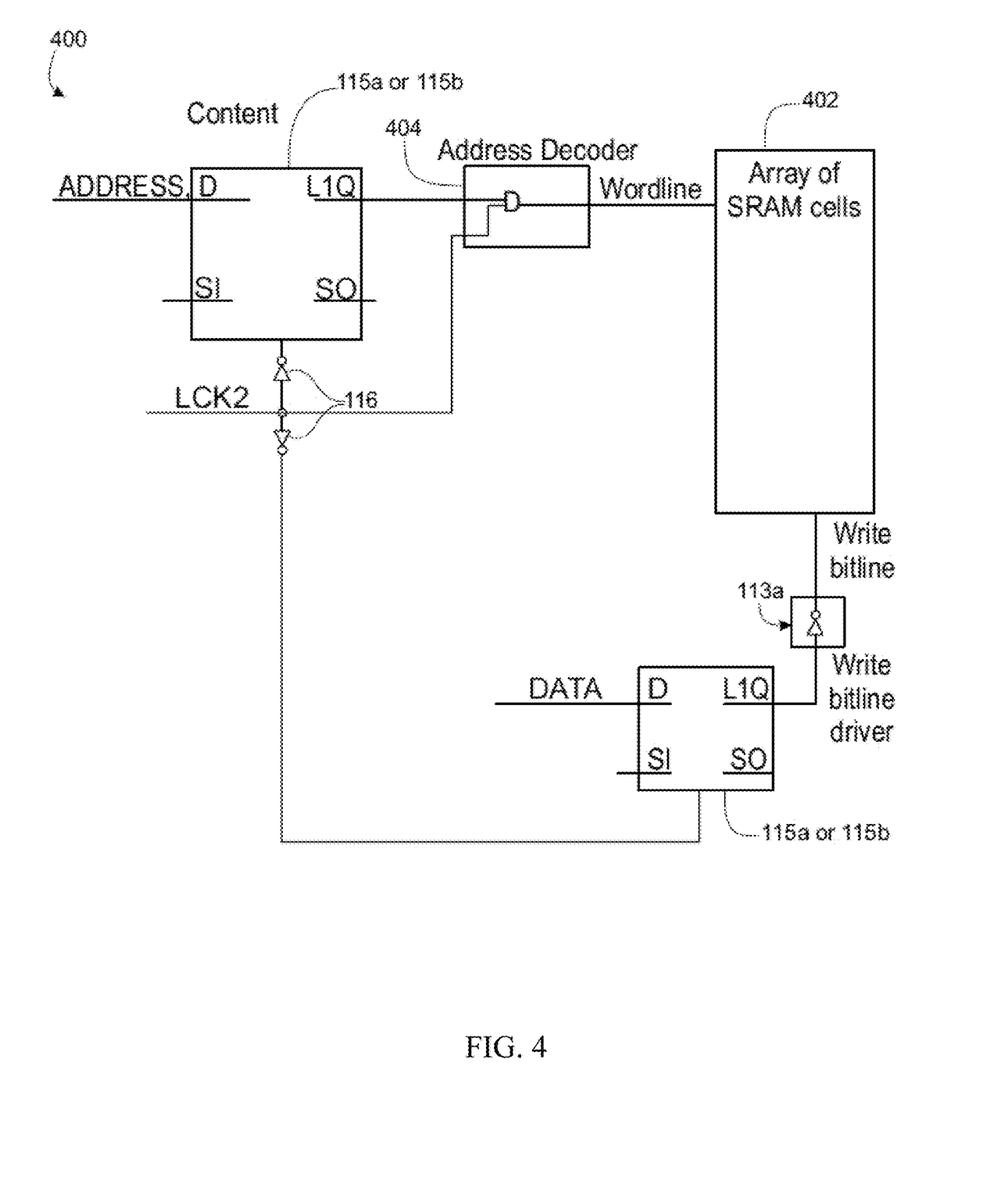
FIG. 4 illustrates a specific example digital logic circuit having an inverter circuit, according to embodiments.

FIG. 4 illustrates a specific example digital logic circuit 400 having an inverting circuit 116, in accordance with at least one embodiment. In an embodiment, a memory array 402 includes an array of static random-access memory (SRAM) cells. In an embodiment, the inverting circuit 116 includes a single inverter. In an embodiment the inverter circuit 116 includes an additional even number of inverting stages to create a delay. In an embodiment the inverter circuit 116 includes a pulse shaping circuitry to shrink or widen the clock pulse.

In an embodiment, the pulsed clock signal feature has a pulse length short enough to avoid a race violation when the derivative clock signal feature and the pulsed clock signal feature both indicate transparency. In an embodiment, the primary scan clock signal feature (SDCK), and secondary scan clock signal feature (SLCK) are non-pulsed.

In an embodiment, the scanable storage element 115a or 115b and the array clock connect to the input of an address decoder 404 and the output of the address decoder 404 connects to the memory array 402. Further, the scanable storage element 115a or 115b are used to store write data and the scanable storage element output connects to a write data driver circuit 113 a input and the write data driver circuit 113 a output connects to the memory array 402.

Therefore the present digital logic circuit 100 and 200 avoid the clock-hazard between clock signal feature (DCK) and array clock signal feature (LCK2) by connecting the inverted LCK2 (LCK2N) instead of DCK to the scanable storage element (L1). A new clock-hazard between the now independently controlled LCK2N and LCK is rendered harmless by using a pulsed LCK. The pulse length may be configured such that there will be no hold violation even if LCK2N is 1 while LCK is 1.

As the independently controlled clocks LCK2N and SDCK may be 1 at the same time/clock phase the new register has two L1 latches and, in an embodiment as shown in FIG. 1, a static multiplexer to choose either of the two as input for the L2. If a level sensitive scan design is not required the scan L1 (second primary flip-flop 108b) in the invention may become optional when a pulsed secondary scan clock SLCK is used. The flip-flops 108b, 110a/b in the scan path may be small as they are only used in a nonperformance critical scan operation.

In another embodiment, there is no static multiplexer in the register. However, the flip-flop (L2) 110b is connected to the LCK and SLCK. The LCK and SLCK generated by the LCB1 104b. If LCK fires, the output of the flip-flop L1 108a is captured in the flip-flop (L2) 110b and if SLCK fires the output of flip-flop 108b is captured in the flip-flop (L2) 110b. LCB1 104b contains logic that prevents LCK and SLCK to be 1 at the same time.

Thus, the present digital logic circuit 100 prevents race violations at the array test control boundary by avoiding clock-hazards as described herein. The advantages of the present digital logic circuit 100 include but are not limited to: standard clock control logic may be used, which also simplifies verification, reduced risk of potential hardware malfunction due to problems that were non-seen during review, and enhanced early mode protection due to close tracking of LCK and LCKN.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. "Set of," "group of," "bunch of," etc. are intended to include one or more. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Therefore, while the foregoing is directed to exemplary embodiments, other and further embodiments of the invention may be devised without departing from the basic scope thereof, and the scope thereof is determined by the claims that follow.

What is claimed is:

1. A digital logic circuit which is configured to deter a race violation at an array test control boundary, comprising:
   a clock generation circuitry having both a clock generation circuitry output and an inverter circuit to generate a derivative clock signal feature, the clock generation circuitry to generate an output clock signal feature including:
   a primary scan clock signal feature,
   a secondary scan clock signal feature, and
   a pulsed clock signal feature; and
   a scannable storage element having both a scannable storage element output and a set of flip-flops, the set of flip-flops including:
   a first primary flip-flop which corresponds to a functional data path of the digital logic circuit, wherein the first primary flip-flop connects with the derivative clock signal feature,
   a second primary flip-flop which corresponds to a scan data path of the digital logic circuit, wherein the second primary flip-flop connects with the secondary scan clock signal feature, and a secondary flip-flop connected to both the pulsed clock signal feature and the secondary scan clock signal feature, wherein the secondary flip-flop is configured to input an output of:
the first primary flip-flop when indicated by the pulsed clock signal feature, and
the second primary flip-flop when indicated by the secondary scan clock signal feature; and
a memory array connected with:
the scannable storage element output,
wherein the digital logic circuit is configured to avoid the race violation between a set of output data of the first primary flip-flop and the pulsed clock signal feature at the secondary flip-flop independent of what the derivative clock signal feature indicates.

2. The digital logic circuit of claim 1, wherein the second primary flip-flop and the secondary flip-flop are part of the scan data path.

3. The digital logic circuit of claim 1, wherein the clock generation circuitry includes:
a first local clock buffer to generate:
the primary scan clock signal feature,
the secondary scan clock signal feature, and
the pulsed clock signal feature; and
a second local clock buffer.

4. The digital logic circuit of 3, wherein the clock generation circuitry is configured to output an output clock signal feature when indicated by a first enable input, and wherein the output clock signal feature is based on what a scan enable input indicates.

5. The digital logic circuit of claim 4, wherein the output signal feature includes the primary and secondary scan clock signal features.

6. The digital logic circuit of claim 4, wherein the output signal feature includes the pulsed clock signal feature.

7. The digital logic circuit of claim 1, wherein all clock signal features are derived from a common global clock signal feature.

8. The digital logic circuit of claim 1, wherein the primary scan clock signal feature is derived from a common global clock signal feature.

9. The digital logic circuit of claim 1, wherein the primary scan clock signal feature is derived from a common global clock signal feature.

10. The digital logic circuit of claim 1, wherein the clock generation circuitry has:
a scan enable input to switch between the pulsed clock signal feature and the primary and secondary scan clock signal features.

11. The digital logic circuit of claim 1, wherein the memory array includes an array of static random-access memory (SRAM) cells.

12. The digital logic circuit of claim 1, wherein the inverter circuit includes a single inverter.

13. The digital logic circuit of claim 1, wherein the inverter circuit includes an odd number of inverting stages to create a delay.

14. The digital logic circuit of claim 1, wherein the inverter circuit includes a pulse shaping circuitry to shrink or widen the clock pulse.

15. The digital logic circuit of claim 1, wherein the pulsed clock signal feature has a pulse length to avoid the race violation when the derivative clock signal feature and the pulsed clock signal feature both indicate transparency.

16. The digital logic circuit of claim 1, wherein both the primary and secondary scan clock signal features are non-pulsed.

17. A digital logic circuit, comprising:
a clock generation circuitry having both a clock generation circuitry output and an inverter circuit to generate a derivative clock signal feature, the clock generation circuitry to generate an output clock signal feature including:
a primary scan clock signal feature,
a secondary scan clock signal feature, and
a pulsed clock signal feature; and
a scannable storage element having both a scannable storage element output and a set of flip-flops, the set of flip-flops including:
a first primary flip-flop which corresponds to a functional data path of the digital logic circuit, wherein the first primary flip-flop connects with the derivative clock signal feature,
a second primary flip-flop which corresponds to a scan data path of the digital logic circuit, wherein the second primary flip-flop connects with the secondary scan clock signal feature, and
a secondary flip-flop connected to both the pulsed clock signal feature and the secondary scan clock signal feature, wherein the secondary flip-flop is configured to input an output of:
the first primary flip-flop when indicated by the pulsed clock signal feature, and
the second primary flip-flop when indicated by the secondary scan clock signal feature; and
a memory array connected with:
the scannable storage element output,
wherein the primary scan clock signal feature is derived from a common global clock signal feature, and wherein the memory array includes an array of static random-access memory (SRAM) cells.

18. The digital logic circuit of claim 17, wherein the clock generation circuitry includes:
a first local clock buffer to generate:
the primary scan clock signal feature,
the secondary scan clock signal feature, and
the pulsed clock signal feature, and
a second local clock buffer;
wherein the clock generation circuitry is configured to output an output clock signal feature when indicated by a first enable input;
wherein the output clock signal feature is based on what a scan enable input indicates; and
wherein the digital logic circuit is configured to avoid race violation between a set of output data of the first primary flip-flop and the pulsed clock signal feature at the secondary flip-flop independent of the-what the derivative clock signal feature indicates.

19. A method of manufacturing a digital logic circuit which is configured to deter a race violation at an array test control boundary, comprising:
constructing a clock generation circuitry having both a clock generation circuitry output and an inverter circuit to generate a derivative clock signal feature, the clock generation circuitry to generate an output clock signal feature including:
a primary scan clock signal feature,
a secondary scan clock signal feature, and
a pulsed clock signal feature;
introducing a scannable storage element having both a scannable storage element output and a set of flip-flops, the set of flip-flops including:

a first primary flip-flop which corresponds to a functional data path of the digital logic circuit, wherein the first primary flip-flop connects with the derivative clock signal feature, a second primary flip-flop which corresponds to a scan data path of the digital logic circuit, wherein the second primary flip-flop connects with the secondary scan clock signal feature, and a secondary flip-flop connected to both the pulsed clock signal feature and the secondary scan clock signal feature, wherein the secondary flip-flop is configured to input an output of:

the first primary flip-flop when indicated by the pulsed clock signal feature, and the second primary flip-flop when indicated by the secondary scan clock signal feature; and structuring a memory array connected with:

the scannable storage element output, wherein the digital logic circuit is configured to avoid the race violation between a set of output data of the first primary flip-flop and the pulsed clock signal feature at the secondary flip-flop independent of what the derivative clock signal feature indicates.

\* \* \* \* \*